United States Patent [19]

Janowiecki et al.

[11] B 4,003,770

[45] Jan. 18, 1977

[54] PLASMA SPRAYING PROCESS FOR PREPARING POLYCRYSTALLINE SOLAR CELLS

[75] Inventors: Richard J. Janowiecki, Dayton; Michael C. Willson, Waynesville; Douglas H. Harris, Dayton, all of Ohio

[73] Assignee: Monsanto Research Corporation, St. Louis, Mo.

[22] Filed: Mar. 24, 1975

[21] Appl. No.: 561,405

[44] Published under the second Trial Voluntary Protest Program on March 30, 1976 as document No. B 561,405.

[52] U.S. Cl. .......................... 148/174; 29/572; 136/89 SG; 148/175; 156/613; 156/614; 357/30; 427/34; 427/86; 427/113

[51] Int. Cl.² ............. H01L 21/203; H01L 31/00

[58] Field of Search ............ 148/174, 175; 136/89; 357/30; 156/613, 614; 427/34, 113, 86; 29/572; 217/121 P

[56] References Cited

UNITED STATES PATENTS

| | | | |
|---|---|---|---|
| 2,537,255 | 1/1951 | Brattain | 136/89 |
| 2,763,581 | 9/1956 | Freedman | 148/175 X |
| 3,010,009 | 11/1961 | Ducati | 427/34 X |
| 3,078,328 | 2/1963 | Jones | 136/89 |
| 3,160,522 | 12/1964 | Heywang et al. | 148/174 X |
| 3,274,007 | 9/1966 | Jones | 427/34 |
| 3,460,240 | 8/1969 | Tarneja et al. | 136/89 |
| 3,485,666 | 12/1969 | Sterling et al. | 204/192 X |
| 3,496,029 | 2/1970 | King et al. | 136/89 X |

*Primary Examiner*—L. Dewayne Rutledge
*Assistant Examiner*—W. G. Saba
*Attorney, Agent, or Firm*—Bruce Stevens

[57] ABSTRACT

Polycrystalline silicon films useful in preparing solar cells primarily for terrestrial application are prepared by a plasma spraying process. A doped silicon powder is injected into a high temperature ionized gas (plasma) to become molten and to be sprayed onto a low-cost substrate. Upon cooling, a dense polycrystalline silicon film is obtained. A p-n junction is formed on the sprayed film by spray deposition, diffusion or ion implantation. A sprayed junction is produced by plasma spraying a thin layer of silicon of opposite polarity or type over the initially deposited doped film. In forming a diffused junction, dopant is applied over the surface of the initial plasma-sprayed film usually from the vapor phase and heat is used to cause the dopant to diffuse into the film to form a shallow layer of opposite polarity to that in the original film. A junction is also formed by implanting dopant ions in the surface of the originally deposited film by the use of electrical fields. When used in conjunction with ohmic contacts and electrical conductors, the p-n junctions produced using plasma-sprayed polycrystalline silicon films are formed into solar cells which are useful for directly converting sunlight into electricity by means of the photovoltaic effect.

6 Claims, 5 Drawing Figures

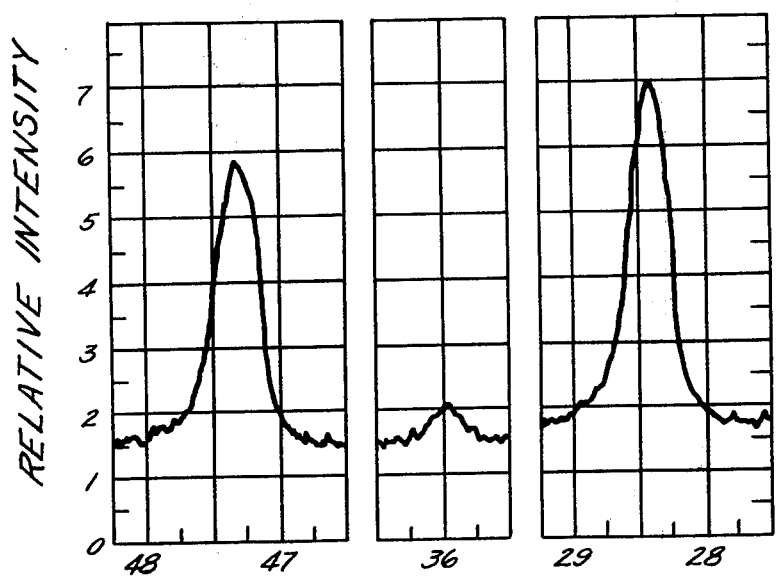
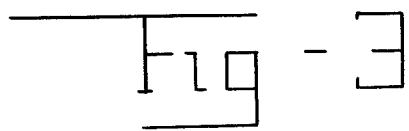

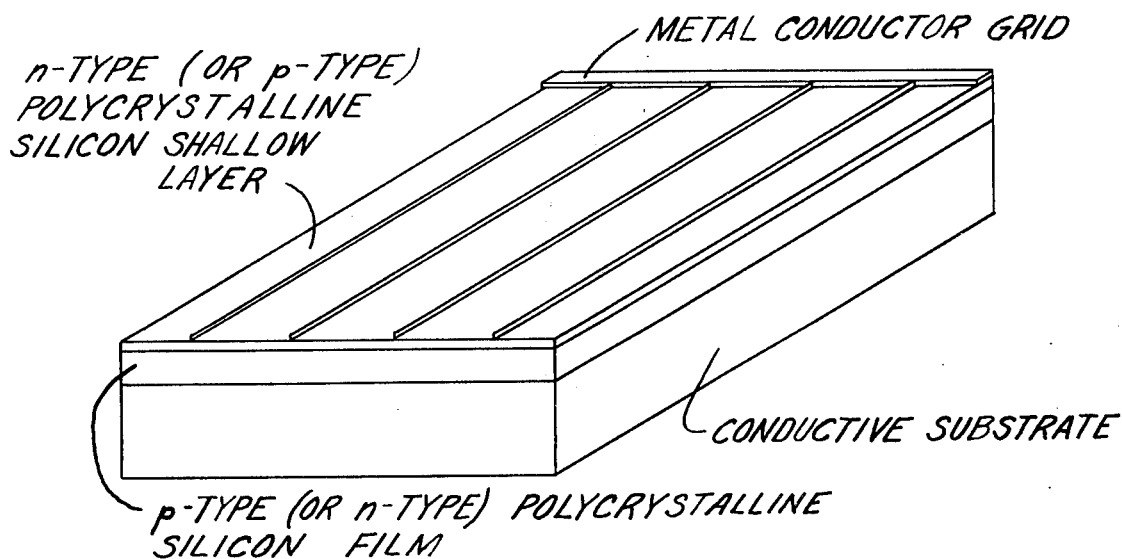
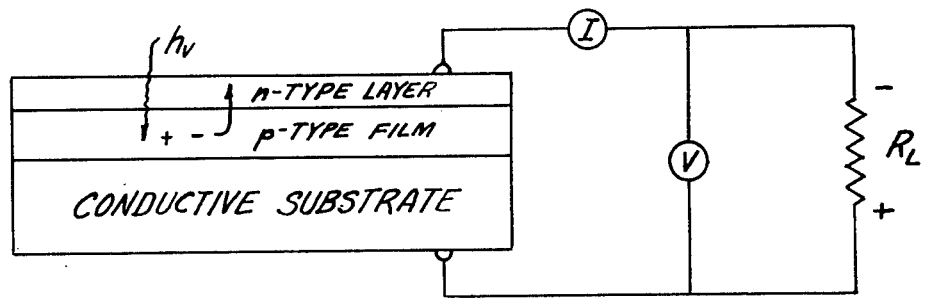
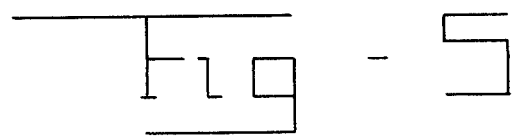

PLASMA SPRAYING PROCESS FOR PREPARING POLYCRYSTALLINE SOLAR CELLS

BACKGROUND OF THE INVENTION

1. Field of the Invention

The present invention relates to the fabrication of low-cost photovoltaic cells primarily for terrestrial applications by plasma spraying techniques. More particularly, it is concerned with a process for plasma spraying polycrystalline silicon films, the subsequent formation of p-n junctions in sprayed films by the use of additional plasma spraying, diffusion, or ion implantation, and the utilization of such p-n junctions to form solar cells which are useful for producing electricity directly from sunlight via the photovoltaic effect. Electrical conductors and antireflective coatings can also be formed on solar cells by plasma spraying or by other means.

2. Description of the Prior Art

Because of the rapid depletion of our natural energy sources, such as domestic oil and natural gas, the pollution problems associated with the use of coal and the slow development of nuclear energy, other energy sources have assumed a new importance. Solar energy is abundantly available in this country and can be utilized without ecological problems. Electricity can be generated from solar energy by sequential conversion (i.e., sunlight to heat, to steam, to mechanical power, to electricity) or by direct conversion via the photovoltaic process. In the photovoltaic effect, an electromotive force is generated when light is allowed to fall upon a rectifying contact or junction such as that contained in a solar cell.

Conventional solar cells are fabricated from single crystal silicon and used mostly in space applications. Single crystal silicon wafers are produced by preparing high quality ingots of doped silicon followed by precise cutting, lapping, and chemical polishing. Another dopant of opposite polarity to that used in the ingot is then diffused into the surface of the wafer to yield a p-n junction. The diffused layer is removed from the back surface and ohmic contacts are applied to that surface. Grid contacts are applied to the diffused surface followed by an antireflective or protective coating. Cells are then mounted on a supporting structure and electrical leads are attached. Conversion efficiencies of 10 to 14% have been observed in solar cells, prepared from single crystal silicon.

A very expensive portion of the process described above for preparing solar cells from single crystal silicon is the preparation of high quality single crystal silicon and its conversion into wafers by precise slicing and polishing procedures. If such single crystal silicon were used in large area solar cells for terrestrial applications, costs would be prohibitive and result in very limited utilization. Polycrystalline silicon with satisfactory properties can be produced and used to form solar cells with acceptable performance characteristics on a low-cost mass-production basis and process economics make costs acceptable for large scale utilization.

In the prior art, polycrystalline silicon films have been produced by chemical vapor deposition and by evaporation. Both processes are slow, requiring much time to produce films of useful thickness, and both processes are conducted in a vacuum environment. The plasma spraying process described herein is a fast deposition process, conducted at essentially atmospheric pressure, capable of the large scale production of low-cost polycrystalline silicon photovoltaic cells in large-area form on an automated, continuous basis. The process is capable of depositing not only polycrystalline silicon but also electrical contacts, antireflective or protective coatings, an other semiconductor materials.

The plasma generators used in this invention are well-known in the art and commercially available. They are electrical devices used for continuously generating a high temperature gas which is partially or completely ionized (called a "plasma"). The high-temperature gas is used for the melting of injected particles and the spraying and deposition of molten particles onto a substrate to solidify and form a polycrystalline film. By injecting doped silicon particles into the hot gas, doped polycrystalline silicon films can be produced. Films can be deposited on an electrical conducting substrate such as a metal or graphite which can then serve as ohmic contact in the solar cell. Metallized nonconductors can also be used as substrates. Free-standing silicon films can be produced by depositing onto removable substrates.

SUMMARY OF THE INVENTION

It is therefore one object of this invention to prepare polycrystalline silicon solar cells suitable primarly for terrestrial applications. It is another object of this invention to provide a low-cost process for preparing solar cells from polycrystalline silicon. It is another object of this invention to prepare polycrystalline silicon films and solar cells from particles of silicon. It is another object of this invention to provide a process for forming p-n junctions in polycrystalline silicon for use in solar cells. It is another object of this invention to form p-n junctions in polycrystalline silicon by the use of plasma spraying. It is another object of this invention to form p-n junctions in polycrystalline silicon by diffusing dopants into a plasma film. It is another object of this invention to form p-n junctions in polycrystalline silicon by implanting ions into a plasma-sprayed film. It is another object of this invention to use heat treatments to develop grains and microstructure in plasma-sprayed polycrystalline silicon films to control the properties of such films. It is another object of this invention to prepare solar cells by depositing polycrystalline silicon films on a substrate in a desired configuration. It is another object of this invention to prepare thin polycrystalline silicon films having areas in the range of appreciably less then 1 square inch to many square feet. It is another object of this invention to prepare polycrystalline silicon films having complex geometry of unusual shapes and sizes. It is a particular object of this invention to prepare solar cells on most any type of substrate such as metals, ceramics, graphite, glass, plastics and surfaces containing electrical conductors or circuits.

These and other objects of the invention can be achieved by a method of preparing solar cells from silicon comprising the steps of: (a) generating a flowing plasma gas stream, (b) heating p- or n-doped silicon particles by injection into said plasma stream, (c) discharging said heated particles from said plasma stream onto a substrate providing a polycrystalline silicon film, (d) during steps (b) and (c) providing a suitable atmosphere surrounding said particles to inhibit oxidation, (e) preparing a p-n junction in said polycrystlline silicon film by diffusion or ion implantation of a dopant of opposite polarity or type into said film or by forming a thin layer on said polycrystalline silicon film by plasma spraying doped silicon particles of opposite polarity or type, and (f) providing electrical conductors to control the flow of electricity produced by illuminating said p-n junction. A protective cover can be provided for the solar cell which, of course, must be sufficiently transparent on the p-n junction surface to be illuminated and glass coatings which can be sprayed on are suitable. Sprayed on conducting glass can be used both as a protective cover and to provide the electrical conductors.

Doped silicon particles can be used for producing plasma-sprayed polycrystalline silicon films. Silicon particles containing a dopant of opposite polarity can be used to form a p-n junction in an initially deposited doped film by plasma spraying. Dopants used conventionally with single crystal silicon can be used to form diffused and ionimplanted p-n junctions in plasma-sprayed doped polycrystalline silicon films. Post-spray thermal treatments can be used to improve the microstructure in plasma-sprayed polycrystalline silicon films before and/or after formation of the p-n junctions.

BRIEF DESCRIPTION OF THE DRAWINGS

In FIG. 3, there are shown X-ray diffraction spectra of plasma-sprayed polycrystalline silicon formed by a process of the invention.

FIG. 4 schematically depicts a typical solar cell of the invention. A p-type (or n-type) polycrystalline film of silicon is deposited by plasma spraying on an electrically conductive substrate, e.g., a graphite or a metallized non-conductive substrate. Then a shallow layer of opposite polarity or type, n-type (or p-type) polycrystalline silicon, is formed on the polycrystalline film of silicon. Finally a grid of metal or other electrical conductor is formed on the top surface of the shallow layer of polycrystalline silicon.

FIG. 5 is a schematic electrical circuit employing a solar cell of FIG. 4 wherein electrical leads are attached to the grid and substrate and these leads are shown attached to a load $R_L$ which can be storage batteries. When the shallow layer of polycrystalline silicon is illuminated as with sunlight, designated as $h\nu$, the p-n junction is penetrated by the light energy, forming holes (+) and electrons (−); the holes recombine and electrons cross the junction providing an electric current (I) which flows in the electrical circuit to charge the batteries $R_L$ and generate a voltage V across $R_L$.

DESCRIPTION OF THE PREFERRED EMBODIMENTS

Figure 1:
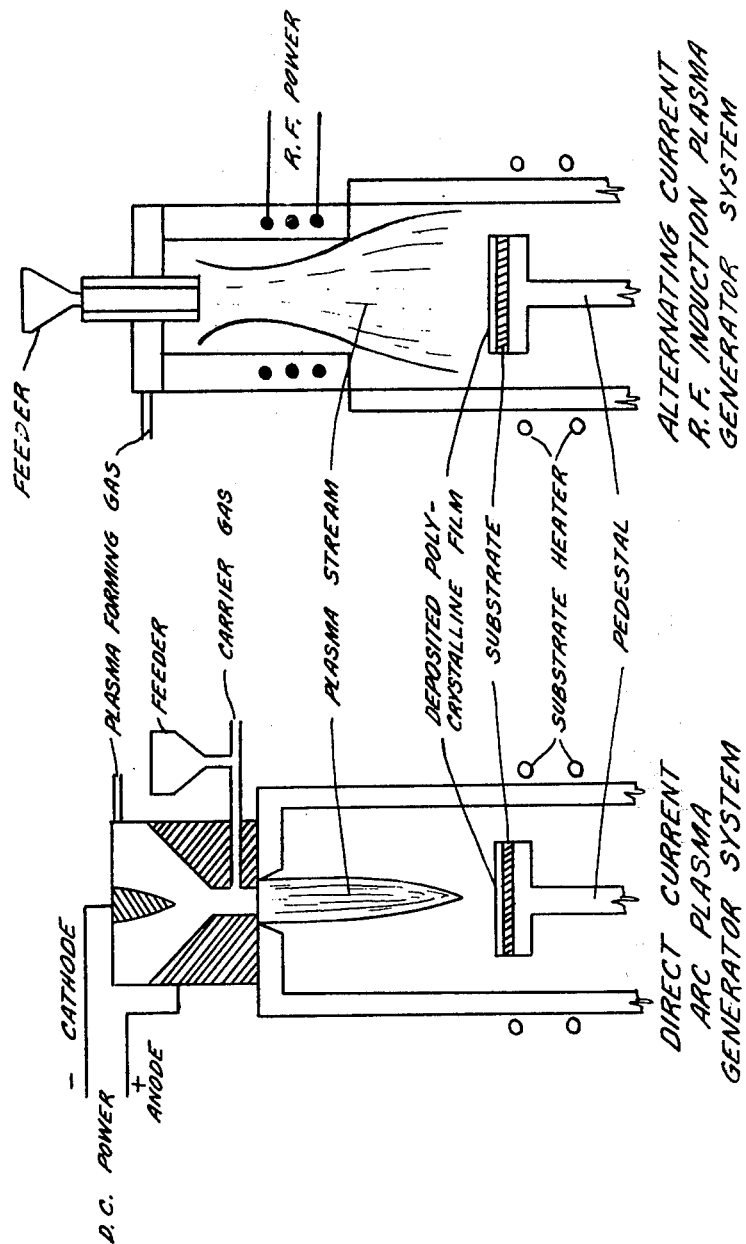
In FIG. 1 there is portrayed schematically two methods for generating continuous plasma streams and utilizing such equipment to produce polycrystalline silicon films for solar cell applications. In the direct current arc plasma generator system, an arc is formed and sustained between a cathode and an anode and a plasma is formed by passing a non-oxidizing plasma-forming gas through the arc. Doped silicon particles are contained in a feeder and carried in a separate gas stream and injected into the torch for transport through the plasma stream to be melted and deposited on a substrate to form a polycrystalline silicon film. In the alternating current radio frequency (r.f.) induction plasma generator system, an arc is produced by a high frequency alternating current induction coil and used to form a plasma stream from a non-oxidizing gas. Silicon particles may be injected axially or in other ways into the plasma stream for melting and deposition on a substrate to form a polycrystalline silicon film.
Figure 2:
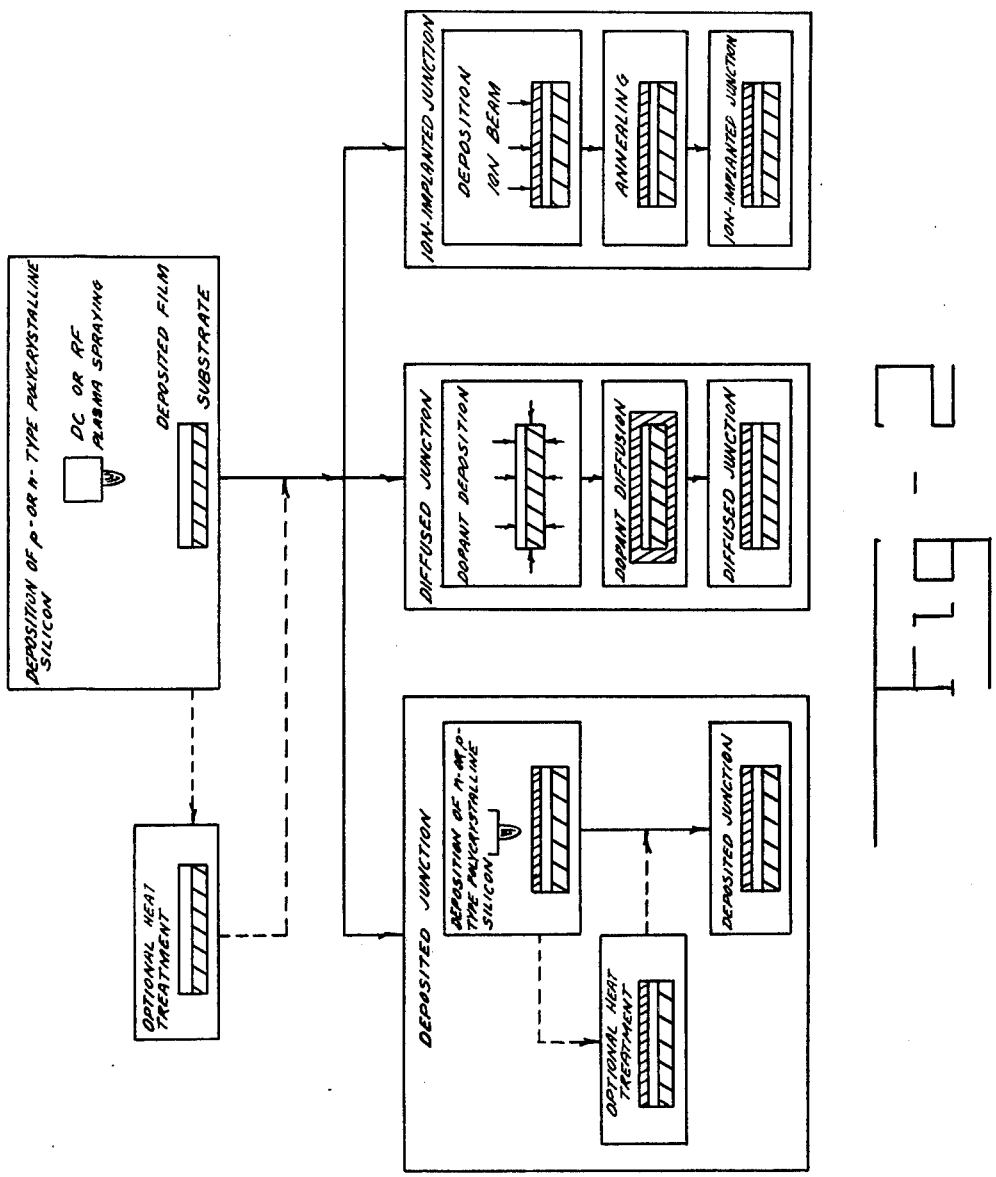
In FIG. 2, there are shown schematically various methods to form p-n junctions in plasma-sprayed polycrystalline silicon. Using a doped polycrystalline silicon film formed by melting powder using a direct current or an r.f. plasma generator, a p-n junction can be formed by plasma-spraying a polycrystalline silicon layer of opposite polarity or type over the initial film or by diffusing dopant atoms or implanting dopant ions into the surface of the initial film.

A number of plasma generators have been reported and used in the prior art. For the purposes of this invention, a commercially available arc plasma torch, Avco PG–100, was found to be useful for depositing polycrystalline silicon. Other arc plasma torches, such as Plasmadyne Model SG–1B and Metco Model 3MB are especially useful when depositing molten particles inside of a large controlled environment chamber. A Lepel inductively coupled r.f. plasma facility is also useful for depositing polycrystalline silicon film. Furthermore, it has been found that an atmosphere should be provided around the molten particles to inhibit oxidation upon discharge from the plasma stream. Process variables that can be optimized for each particular arc plasma or induction plasma generator system are: substrate type and preheat temperature; plasma generator configuration; plasma forming gas composition and flow rate; input electrical power; powder particle size, feedrate and method of injection; spraying distance or dwell time of particles in the high temperature gas; and post-spray thermal treatment, but these are capabilities within the state of the art.

Well-bonded polycrystalline silicon films were deposited by arc plasma spraying onto various substrates including steel, molybdenum, copper, titanium alloy, quartz and spinel. Free-standing platelets were produced by removing the substrate after thick silicon layers were deposited. Doped and undoped spray powders in various particle sizes were used; substrate preheat temperatures that were used varied between room temperature and ~1150°C.

Using plasma-sprayed polycrystalline silicon films, p-n junctions were formed by diffusion and can be formed by plasma spray deposition and by ion inplantation.

Deposited Junctions

A deposited junction is formed by depositing individual and adjacent p- and n-type silicon films on a given substrate using plasma spraying. Silicon films are deposited using d.c. arc plasma spraying or using r.f. induction torch spraying. Either of two basic procedures can be used to form deposited junctions: (1) a p-type (or n-type) film is deposited on a substrate; the deposition is interrupted and an n-type (or p-type) film is subsequently deposited over the initial film; or, (2) a p-type (or n-type) film is deposited on a substrate and an n-type (or p-type) film is immediately deposited over the initial layer without interrupting the deposition and growth process. The layer deposited to form the junction is of the order of microns better known as a shallow layer, whereas, the basic polycrystalline silicon film in which the junctions are formed is normally a mil or a number of mils.

Heat treatment of deposited films and junctions is sometimes useful in improving the performance characteristics of such materials.

Diffused Junctions

Diffusion is presently the most widely used junction formation technique for single crystalline silicon devices primarily because the surface concentration of common dopants (such as boron, phosphorus and arsenic) in silicon and the junction depth can be controlled reproducibly to a high degree. Diffusion has also been used to add electrically active impurities to polycrystalline silicon films formed by chemical vapor deposition.

Boron tribromide and phosphorus oxytrichloride are representative of source materials that can be used to deposit dopant oxides onto plasma-sprayed silicon films. Boron oxide is deposited in the temperature range of 850° to 950°C. while phosphorus oxide is deposited at 750° to 850°C. Shallow p-n junctions are formed using a dopant deposition time of 0.5 to 1.5 hours.

Alternatively, elemental boron and phosphorus can be diffused as dopants into plasma-sprayed silicon films.

The sheet resistance of the diffused layer, measured by using a four-point probe, and the junction depth and planarity of the junction, observed on an angle-polished and stained diffused specimen, indicate that satisfactory p-n junctions can be formed in plasma-sprayed polycrystalline silicon by the diffusion process.

Ion-Implanted Junctions

In recent years, ion-implantation has become an effective technique for fabricating silicon junction devices. In this technique dopants are introduced into silicon through bombardment by dopant ions accelerated to high energies. The formation of shallow junctions in polycrystalline silicon can be controlled more reproducibly by ion-implantation than by diffusion. While diffusion is enhanced along structure defects such as grain boundaries, ion-implantation is relatively insensitive to crystal defects, thus producing a more uniform junction.

Boron and phosphorus ions can be implanted in plasma-sprayed silicon films to form shallow p-n junctions displaying useful current-voltage characteristics.

The invention is further illustrated by, but not limited to, the following examples.

Example 1

A 14-mil thick film of silicon was deposited on a 2 × 2 quartz substrate preheated to 500°C. using arc plasma spraying. A p-type boron-doped silicon powder, prepared to have a resistivity of 4 to 8 ohm-cm, was used during plasma spraying. The substrate was subsequently removed and the fracture cross-section of the platelet, observed with a scanning electron microscope, showed the formation of relatively large grain and low porosity. The X-ray diffraction spectra of the as-sprayed platelet indicated that the deposit consisted essentially of polycrystalline silicon.

A section of sprayed platelet was heated at 800°C. in an inert atmosphere and was subsequently found to exhibit the followint properties:
1 p-type conductivity
2 density of 2.29 g/cc
3 electrical resistivity averaging 10.1 ohm-cm on one side and 9.4 ohm-cm on the other side.

An n-type phosphorus dopant was diffused into the surface and a device containing a p-n junction was produced using state of the art procedures for metallization, etc. Upon illumination, a photovoltaic output was noted and the current-voltage curve was linear.

Other platelets were heated at 1200°C. and 1350°C. Good density was observed in the sprayed and heat treated platelets. The very small amount of isolated pores that were observed can be eliminated by modification of the process conditions. Some relatively large grains were observed in the platelet particularly near one face which was thought to have been the initial layer deposited and this is desirable for solar cells.

Example 2

A 3-mil thick film of silicon was plasma-sprayed onto an unheated 45-mil thick, 1 × 1 titanium substrate. A course undoped silicon spray powder was used. The X-ray diffraction pattern (FIG. 3) showed the as-sprayed film to consist essentially of polycrystalline silicon. No heat treatment studies were conducted with this film.

Example 3

A 3-mil thick film was formed by plasma spraying a relatively fine boron-doped silicon powder onto a preheated 5-mil thick molybdenum substrate.

Example 4

6-mil thick films were deposited without substrate preheating by plasma spraying a relatively coarse undoped silicon powder onto 40-mil thick, 2 × 2 inches titanium and 25-mil thick, 1 ×1 inch steel substrates.

Example 5

An 18-mil thick free-standing platelet was produced by plasma spraying a polycrystalline silicon powder, which was not deliberately doped, onto a highly preheated, 1 ×1 inch alumina substrate. After spraying, the coated substrate was sectioned and removed to yield free-standing silicon platelets. The microstructure of a sectioned platelet, observed on a Zeiss metallograph, displayed low porosity and the layered stringers frequently found in other as-sprayed deposits.

Example 6

A p-type polycrystalline silicon film is deposited on a substrate using plasma spraying. After sufficient thickness is built up, the deposition is interrupted and an n-type polycrystalline silicon film is subsequently deposited by plasma spraying over the initial film. The resulting p-n junction generates an e.m.f. upon illumination.

Example 7

An n-type polycrystalline silicon film is deposited by plasma spraying on a substrate and a p-type polycrystalline silicon film is immediately deposited by plasma spraying over the initial layer without interrupting the deposition and growth process. A functional p-n junction is obtained.

Example 8

An n-type polycrystalline silicon film is plasma-sprayed onto a substrate. Boron oxide is deposited and diffused into the initial layer using a temperature of 900°C. A shallow p-n junction is formed using a deposition time of 1 hour.

Example 9

A p-type polycrystalline silicon film is plasma-sprayed onto a substrate. Phosphorus oxide is deposited and diffused into the initial layer using a temperature of 800°C. A shallow p-n junction is formed within 1 hour.

Example 10

An n-type polycrystalline silicon film is plasma-sprayed onto a substrate. Boron ions are subsequently implanted into the initial sprayed film using ion-implantation. A shallow p-n junction displaying useful current-voltage characteristics is formed.

Example 11

A p-n type polycrystalline silicon film is plasma-sprayed onto a substrate. Phosphorus ions are implanted into the initial film to form a shallow p-n junction with useful characteristics.

Advantages of the plasma spraying process for solar cell fabrication are summarized below:

1. High quality, dense polycrystalline silicon films and structures can be fabricated directly from powders.
2. A wide choice of substrates can be used including metals, ceramics, glass, plastics, graphite and other materials.
3. High strength bonding of sprayed silicon coatings to substrates can be achieved.
4. The physical, chemical and electrical properties of the sprayed deposit can be controlled of process variables.
5. Films can be deposited in large areas and on complex shapes in thicknesses from micrometers to many mils.
6. Besides polycrystalline silicon, the plasma spraying process can be used to deposit other portions of the solar cell, namely, electrical conductors and antireflective or protective cover layers which of course must be sufficiently transparent on the area of the cell to be illuminated.
7. The spraying process is mass-production oriented permitting high deposition rates with good reproducibility. It can be scaled up and automated for routine deposition and all fabrication to yield cost reductions.

Although the invention has been described in terms of specified embodiments which are set forth in considerable detail, it should be understood that this is by way of illustration only and that the invention is not necessarily limited thereto, since alternative embodiments and operating techniques will become apparent to those skilled in the art in view of the disclosure. For example, undoped silicon particles can be plasma sprayed to form a polycrystalline silicon film, said film can be doped either p- or n-type by diffusion or ion implantation, then doping by n- or p-type dopant can be done on a thin layer of said p- or n-doped film by diffusion or ion implantation to form a p-n junction; or, after doping with the p- or n-type, a thin layer of n- or p-doped silicon particles can be plasma sprayed on the p- or n-doped polycrystalline silicon film to form a p-n junction. Accordingly, modifications are comtemplated which can be made without departing from the spirit of the described invention.

What is claimed is:

1. A process for preparing solar cells comprising the steps of:
    a. generating a flowing plasma gas stream,
    b. heating p- or n-doped silicon particles by injection into said plasma stream,
    c. discharging said heated particles from said plasma stream onto a substrate providing a polycrystalline silicon film,
    d. during steps (b) and (c) providing a suitable atmosphere surrounding said particles to inhibit oxidation,
    e. preparing a p-n junction in said polycrystalline silicon film by diffusion or ion-implantation of a dopant of opposite polarity or type into said film or by forming a layer on said polycrystalline silicon film by plasma spraying doped silicon particles of opposite polarity or type, and
    f. providing electrical conductors to control the flow of electricity produced by illuminating said p-n junction.

2. A process of claim 1 wherein said p-type dopant is boron and said n-type dopant is phosphorus.

3. A process of claim 1 wherein said p-n junctions are prepared in step (e) by ion implantation.

4. A process of claim 1 wherein said p-n junctions are prepared in step (e) by diffusion.

5. A process of claim 1 wherein said p-n junctions are prepared in step (e) by plasma spraying.

6. A process of claim 1 wherein said polycrystalline film is heat treated to improve grain size.

* * * * *